US010192740B2

(12) United States Patent
Young et al.

(10) Patent No.: US 10,192,740 B2
(45) Date of Patent: *Jan. 29, 2019

(54) HIGH THROUGHPUT SEMICONDUCTOR DEPOSITION SYSTEM

(71) Applicants: Alliance for Sustainable Energy, LLC, Golden, CO (US); Wisconsin Alumni Research Foundation, Madison, WI (US)

(72) Inventors: David L. Young, Golden, CO (US); Aaron Joseph Ptak, Littleton, CO (US); Thomas F. Kuech, Madison, WI (US); Kevin Schulte, Denver, CO (US); John D. Simon, Littleton, CO (US)

(73) Assignees: Alliance for Sustainable Energy, LLC, Golden, CO (US); Wisconsin Alumni Research Foundation, Madison, WI (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/707,642

(22) Filed: Sep. 18, 2017

(65) Prior Publication Data

US 2018/0025902 A1    Jan. 25, 2018

Related U.S. Application Data

(60) Continuation of application No. 14/801,551, filed on Jul. 16, 2015, now Pat. No. 9,824,890, which is a
(Continued)

(51) Int. Cl.
*C30B 21/04* (2006.01)
*H01L 21/02* (2006.01)
(Continued)

(52) U.S. Cl.
CPC .......... *H01L 21/0262* (2013.01); *C30B 25/08* (2013.01); *H01L 21/02631* (2013.01); *H01L 21/02658* (2013.01); *C30B 29/40* (2013.01)

(58) Field of Classification Search
CPC .......... C30B 21/20; C30B 21/04; C30B 23/02
See application file for complete search history.

(56) References Cited

U.S. PATENT DOCUMENTS 4,504,329 A    3/1985  Quinlan et al.
6,706,119 B2   3/2004  Tsvetkov et al.
(Continued)

OTHER PUBLICATIONS

Chu, S. et al., "Gallium Contamination of InP Epitaxial Layers in InP/InGaAsP Multilayer Structures Grown by Hydride Transport Vapor Phase Epitaxy," Journal Electrochemical Society, vol. 132, No. 5, May 1985, pp. 1187-1193.
(Continued)

*Primary Examiner* — Robert M Kunemund
(74) *Attorney, Agent, or Firm* — Michael A. McIntyre

(57) ABSTRACT

A reactor for growing or depositing semiconductor films or devices. The reactor may be designed for inline production of III-V materials grown by hydride vapor phase epitaxy (HVPE). The operating principles of the HVPE reactor can be used to provide a completely or partially inline reactor for many different materials. An exemplary design of the reactor is shown in the attached drawings. In some instances, all or many of the pieces of the reactor formed of quartz, such as welded quartz tubing, while other reactors are made from metal with appropriate corrosion resistant coatings such as quartz or other materials, e.g., corrosion resistant material, or stainless steel tubing or pipes may be used with a corrosion resistant material useful with HVPE-type reactants and gases. Using HVPE in the reactor allows use of lower-cost precursors at higher deposition rates such as in the range of 1 to 5 μm/minute.

16 Claims, 8 Drawing Sheets

Related U.S. Application Data division of application No. 13/895,190, filed on May 15, 2013.

(60) Provisional application No. 61/648,009, filed on May 16, 2012.

(51) Int. Cl.
   *C30B 25/08* (2006.01)
   *C30B 29/40* (2006.01)

(56) References Cited

U.S. PATENT DOCUMENTS

| | | | |
|---|---|---|---|
| 9,824,890 B2 * | 11/2017 | Young | C30B 25/08 |
| 2010/0151129 A1 | 6/2010 | Schmid et al. | |
| 2010/0310769 A1 | 12/2010 | Armour et al. | |

OTHER PUBLICATIONS

Fan, J. et al., "Simplified fabrication of GaAs homojunction solar cells with increased conversion efficiencies," Applied Physics Letters, vol. 36, Issue 6, Mar. 15, 1978, pp. 390-392.

Geisz, J. et al., "40% efficient inverted triple-junction solar cell with two independently metamorphic junctions," Applied Physics Letters, vol. 93, No. 12, Sep. 22, 2008, pp. 123505-1-123505-3.

Lourdudoss, S. et al., "Hydride Vapor Phase Epitaxy Revisited," IEEE Journal of Selected Topics in Quantum Electronics, vol. 3, No. 3, Jun. 1997, pp. 749-767.

Lush, G. et al., "Thin film approaches for high-efficiency III-V cells," Solar Cells, vol. 30, Issues 1-4, May 1991, pp. 337-344.

Lynch, C. et al., "Characterization of HPVE-Grown Thick GaAs Structures for IR and THz Generation," Indium Phosphide and Related Materials Conference Proceedings, 2006 International Conference, pp. 151-154.

Nishibe, T. et al. "Hydride VPE Growth Technique for InP/GaInAsP System," Journal of Crystal Growth, vol. 94, 1989, pp. 588-596.

Olsen, G. et al., "Crystal Growth and Properties of Binary, Ternary and Quaternary (In,Ga)(As,P) Alloys Grown by the Hydride Vapor Phase Epitaxy Technique," Progress in Crystal Growth and Characterization of Materials, vol. 2, 1979, pp. 309-375.

Olsen, G. "Vapor-Phase Epitaxy of Group III-V Compound Optoelectronic Devices," Chemical and Physical Processing of Integrated Circuits, Chapter 12, 1985, pp. 221-240.

Schulte, K. et al., "Controlled formation of GaAs pn junctions during hydride vapor phase expitaxy of GaAs," Journal of Crystal Growth, vol. 352, Issue 1, Aug. 2012, pp. 253-257.

Susa, N. et al., "Continuous Growth of High Purity InP/InGaAs on InP Substrate by Vapor Phase Epitaxy," Japanese Journal of Applied Physics, vol. 20, No. 4, Apr. 1981, pp. L253-L256.

Wong, M. et al., "Low nonalloyed Ohmic contact resistance to nitride high electron mobility transistors using N-face growth," Applied Physics Letters, vol. 91, Issue 23, Dec. 3, 2007, pp. 232103-1-232103-3.

* cited by examiner

HIGH THROUGHPUT SEMICONDUCTOR DEPOSITION SYSTEM

RELATED APPLICATIONS

This application is a continuation of U.S. patent application Ser. No. 14/801,551, filed Jul. 16, 2015, now U.S. Pat. No. 9,824,890 which is a divisional of U.S. patent application Ser. No. 13/895,190, filed May 15, 2013, now abandoned, which claims priority from U.S. Provisional Application No. 61/648,009, filed May 16, 2012, the disclosures of which are incorporated by reference in their entireties.

CONTRACTUAL ORIGIN

The United States Government has rights in this invention under Contract No. DE-AC36-08GO28308 between the United States Department of Energy and the National Renewable Energy Laboratory managed and operated by Alliance for Sustainable Energy, LLC.

BACKGROUND

There is an ongoing demand for semiconductor deposition systems and methods that provide high quality products while also providing high and relatively inexpensive throughput. For example, the solar power industry continues to search for improved ways to produce photovoltaic (PV) cells, and wafer silicon (Si) modules have seen decreases in manufacturing costs (or unit cost per unit of power produced (sometimes labeled $/W)), and there is need for this trend to continue for solar power to be more widely adopted. However, manufacturing cost modeling has shown that it may be difficult for both high and low efficiency wafer Si technologies to reach target cost goals (e.g., $0.50/W modules).

As one particular example of a need for new semiconductor deposition systems, III-V solar cells have world-leading efficiencies, but high production costs negate or overshadow the value delivered by higher efficiencies. The production of efficient multi-layered III-V semiconductor devices such as solar cells demands the formation of sharp interface transitions between layers of varying composition and may utilize chemical vapor deposition (CVD) processes. For example, in multi-layered PV devices, deposition of the multiple layers provided in a single junction device (e.g., back surface field, base, emitter, window) has to be able to provide transitions in composition between, for example, indium gallium phosphide (InGaP) and gallium arsenide (GaAs), with simultaneous transitions in doping type and concentration. Inaccurate placement of dopants or a graded transition in layer composition that can occur with existing deposition processes at high growth rates degrades device performance.

Presently, these types of multilayer, multi junction devices are typically deposited using metal-organic vapor phase epitaxy (MOVPE), which offers a high level of control over the epitaxial growth process. MOVPE is generally carried out under conditions in which the growth is mass transport limited. The ability to form sharp interfaces is, therefore, limited by the specific gas flow dynamics and the speed with which gases can be switched and purged from the reactor. As a result, the design of the reactor and the employed growth conditions can determine the properties of the resulting structures. There can also be interaction between the reactants and the inner surfaces of the reactor system and gas panel leading to transients in the compositional and dopant profiles. For example, hydrogen selenide ($H_2Se$) can adsorb on stainless steel, which alters the delivery of this reactant to the growth system, and magnesium (Mg) and zinc (Zn) have demonstrated memory effects. Almost all III-V solar cells are presently grown using MOVPE because of the high material quality, interface control in multilayer devices, and the availability of highly-purified metalorganic precursors it offers, but MOVPE-based processes are very expensive. As a result, a radically different growth process is needed for III-V solar cells to obtain one-sun grid parity or to even come close to competing with Si modules.

Hydride vapor phase epitaxy (HVPE) has been demonstrated to grow a variety of junction devices at significantly higher growth rates than MOVPE and other deposition techniques such as molecular beam epitaxy (MBE). HVPE growth rates approaching or exceeding several hundred microns per hour have been demonstrated in various materials systems whereas MOVPE growth rates are much lower at 1 to 5 micrometers per hour. There is a belief that such an increase in growth rate could provide cost reductions due to a higher reactor throughput. For example, the manufacture of III-V photovoltaics could be developed into a more cost-effective approach for terrestrial energy production with an increased growth rate if high efficiencies could also be maintained in the deposition process because growth rate and not using metal organic precursor molecules lowers the cost of devices made by HVPE.

However, there are a number of challenges associated with the application of HVPE to the manufacture of semiconductor devices such as PV devices. For example, it is difficult when using HVPE to provide useful or desirable formation of both sharp interfaces (e.g., a heterojunction interface) and well-controlled doping profiles. The HVPE process is considered a near-to-equilibrium growth process allowing the growth to be modeled using equilibrium thermodynamics, and HVPE is also typically characterized by lower gas velocities and the use of a hot wall, quasi-isothermal reactor system. These reactor and growth conditions have led to difficulties in controlling interface sharpness. Device deposition can be deteriorated by the presence of transient flows, especially within the source zone where the metal chlorides (used as the active growth reactant) are formed in situ.

Various approaches have been used to mitigate these challenges including the formation of compositional and dopant transients, but none has yet proven wholly satisfactory. In some instances, individual layers are grown in separate reactors and within separate growth runs. The samples are removed from the growth zone, gas flows are switched and equilibrated, and the growth then resumed with the reintroduction of the samples to the growth zone. Generally, there are two main variations: (1) growth in a single reactor with an interruption (e.g., where either the sample is protected under H2/Group V ambient or where the sample is pulled out of the reactor completely while growth of the next layer is recalibrated); and (2) growth in a reactor that has multiple barrels with reactants of different composition (e.g., the sample is simply transferred from barrel to barrel to grow the desired layers). In some of these applications, a system has been used in which the sources are removed from the source zone after layer growth in order to halt transient growth. The use of a growth interruption may be the simplest method, but the exposure of the growth-interrupted interface to the flowing ambient while chemistry flows are reestablished leads to the accumulation of impurities at the interface and corresponding degraded electrical performance.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods that are meant to be exemplary and illustrative, not limiting in scope. In various embodiments, one or more of the above-described problems have been reduced or eliminated, while other embodiments are directed to other improvements.

A deposition or reactor system is provided for growing or depositing semiconductor films such as, but not limited to, photovoltaic (PV) modules. The reactor system (or simply "reactor") in some exemplary applications is designed for inline production of semiconductor materials grown by hydride vapor phase epitaxy (HVPE). The operating principles of the HVPE reactor can be used to provide a completely or partially inline reactor for many different materials. An exemplary design of the reactor is shown in the attached drawings. In some instances, all or many of the pieces of the reactor formed of quartz, such as welded quartz tubing or corrosion resistant tubing, while other reactors are made from metal with appropriate corrosion resistant coatings such as quartz or other materials (e.g., stainless steel tubing or pipes may be used with a corrosion resistant material useful with HVPE-type reactants and gases). The use of HVPE in the reactor allows use of lower-cost precursors (e.g., pure metals rather than organometallic engineered molecules that are 5 to 10 times more expensive than pure metals), and the HVPE reactor can produce higher deposition rates such as 1 to 5 µm/minute.

In addition to the exemplary aspects and embodiments described above, further aspects and embodiments will become apparent by reference to the drawings and by study of the following description.

BRIEF DESCRIPTION OF THE DRAWINGS

Exemplary embodiments are illustrated in referenced figures of the drawings. It is intended that the embodiments and figures disclosed herein are to be considered illustrative rather than limiting.

DETAILED DESCRIPTION

Figure 1:
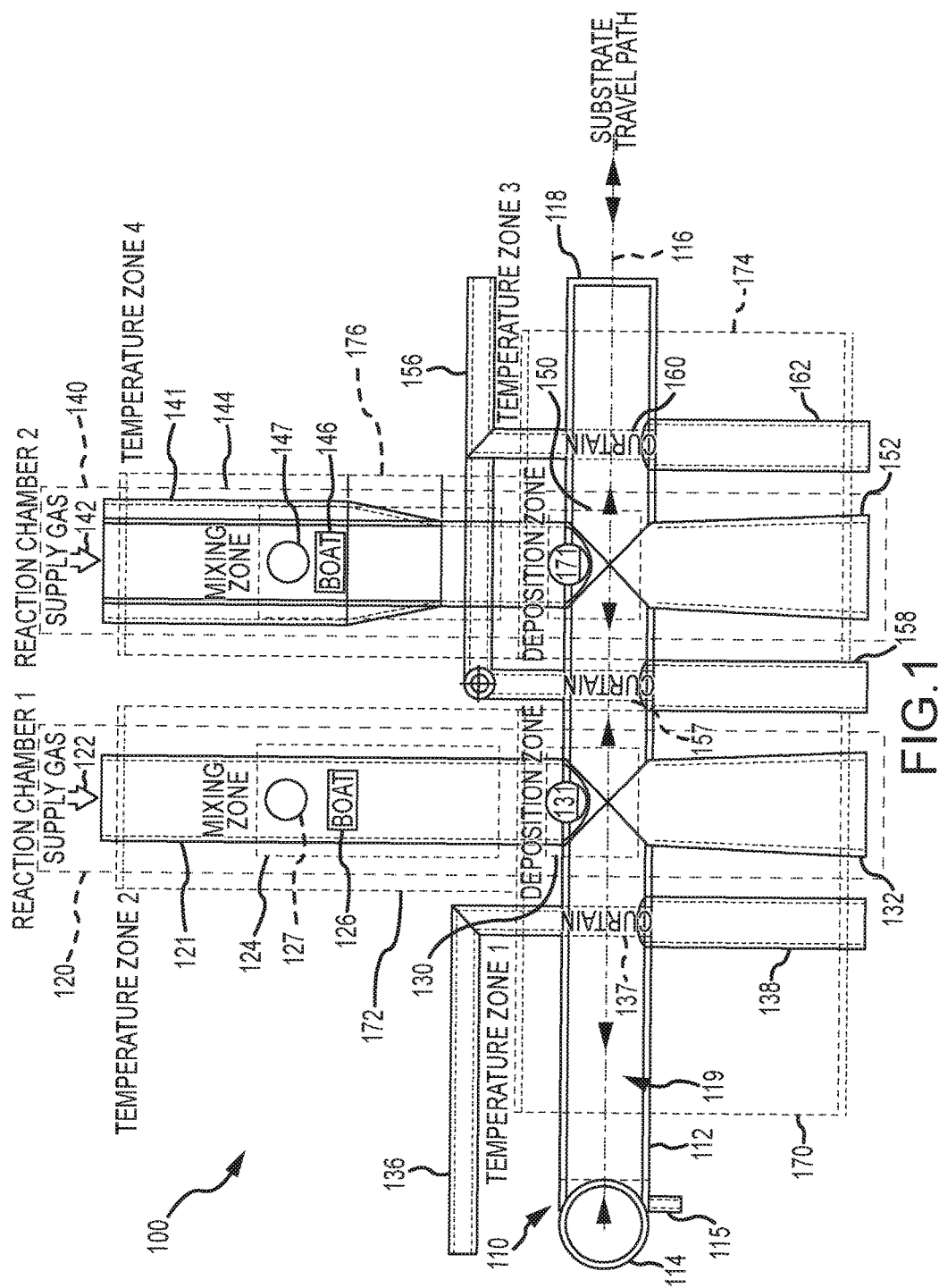
FIG. 1 illustrates a side view of a high throughput HVPE reactor (or reactor or deposition system) that may be used for deposition of semiconductor materials, with temperature zones and portions of a pair of separate reaction chambers shown schematically with dashed lines.

The following provides a description of exemplary systems and methods for providing high throughput deposition of semiconductor layers to fabricate a multi-layer device such as, but not limited to a photovoltaic (PV) module. The described reactor systems facilitate low-cost, high material utilization and high growth rate of III-V materials by hydride vapor phase epitaxy (HVPE), e.g., the systems described herein may be thought of as high throughput HVPE reactors. These HVPE reactors are designed to allow formation of sharp interfaces by moving a substrate between two or more separated growth chambers that may be provided in a single reaction tube, and the separation may be provided by a number of techniques such as use of a gas curtain or a positionable barrier between the growth chambers. Such a multi-chamber design can be contrasted with prior single chamber design in which different layers were grown by halting growth and changing the growth chemistry. Note, multi-barrel designs have been used and described, but these are batch systems that do not suggest or lend themselves to an inline approach. The HVPE reactors described allow for inline growth rather than requiring batch growth, although the described reactors may also be used as a batch reactor.

It was recognized by the Applicants that the growth of III-V materials by HVPE is less expensive than by metalorganic vapor-phase epitaxy (MOCVD) because, in part, HVPE does not require expensive metalorganic precursors. The two or more HVPE reaction chambers provided in the taught HVPE reactors or reactor systems facilitate growth of electronic semiconductor devices by providing a way to form sharp interfaces or junctions. Another advantage of these separate reaction chambers is the independent choice of reaction conditions such as temperature that promote the deposition of certain alloys over others as dictated by the near equilibrium nature of the process (e.g., lower temperature is useful for InGaP growth versus GaAs growth). Generally, it is not feasible to change the furnace temperature in the middle of a multilayer growth in a single reaction chamber. Junction formation has been a problem with previous HVPE reactors because it takes time to change the reactant (e.g., Group III reactant) flows and growth temperatures and due to cross contamination. In contrast, the HVPE reactor design described herein can be used to keep the chemical reaction constant within a specific area of the reactor (e.g., within each reactor chamber), and the substrate may be moved relatively quickly between the different reaction chambers to grow different materials and without halting growth, resetting chemistry, and resetting reactor temperature, all of which can significantly delay the deposition process and lead to quality issues. Gas curtains or other separation devices are used to keep cross-talk or gas flows between reaction zones to a minimum. The high throughput HVPE reactor design incorporates principles of inline growth rather than batch growth. Ideas captured in this description, in fact, may readily be used to build and operate a fully inline reactor.

FIG. 1 illustrates a high throughput HVPE reactor (or reactor or deposition system) 100 that may be used for growth or deposition of semiconductor materials such as to form the multiple layers of PV devices or other semiconductor devices using HVPE. The HVPE reactor 100 is adapted to allow steady state chemistry to be established in two or more reaction chambers and then to allow a wafer or substrate (the device being fabricated) to be moved between the reaction chambers with minimal delay and without the need to heat up or cool down zones or to re-establish new chemistries.

As shown, the HVPE reactor 100 includes a reaction tube (or passageway or transfer tunnel) 110 that includes an elongate body 112 (e.g., a quartz tube, a metal pipe with corrosion coating on inner surfaces, or the like). The body 112 is hollow to define an enclosed and sealed volume or space through which a substrate or wafer can travel during deposition steps as shown with travel path 116. In this case, the path 116 includes arrow heads indicating travel in either direction as a transfer arm, a conveyor mechanism, or the like (not shown but understood by those skilled in the art) may be used to move the wafer or substrate within the reaction tube 110 back and forth between growth and heat/temperature zones (as discussed below). In other implementations, though, an inline reactor may be provided by including additional reaction chambers such that the wafer or substrate would be moved in a single direction through the reactor, and the described reactors and operations to produce a multi-layer device are not limited to movements in both directions in the reaction tube 110.

Figure 4:
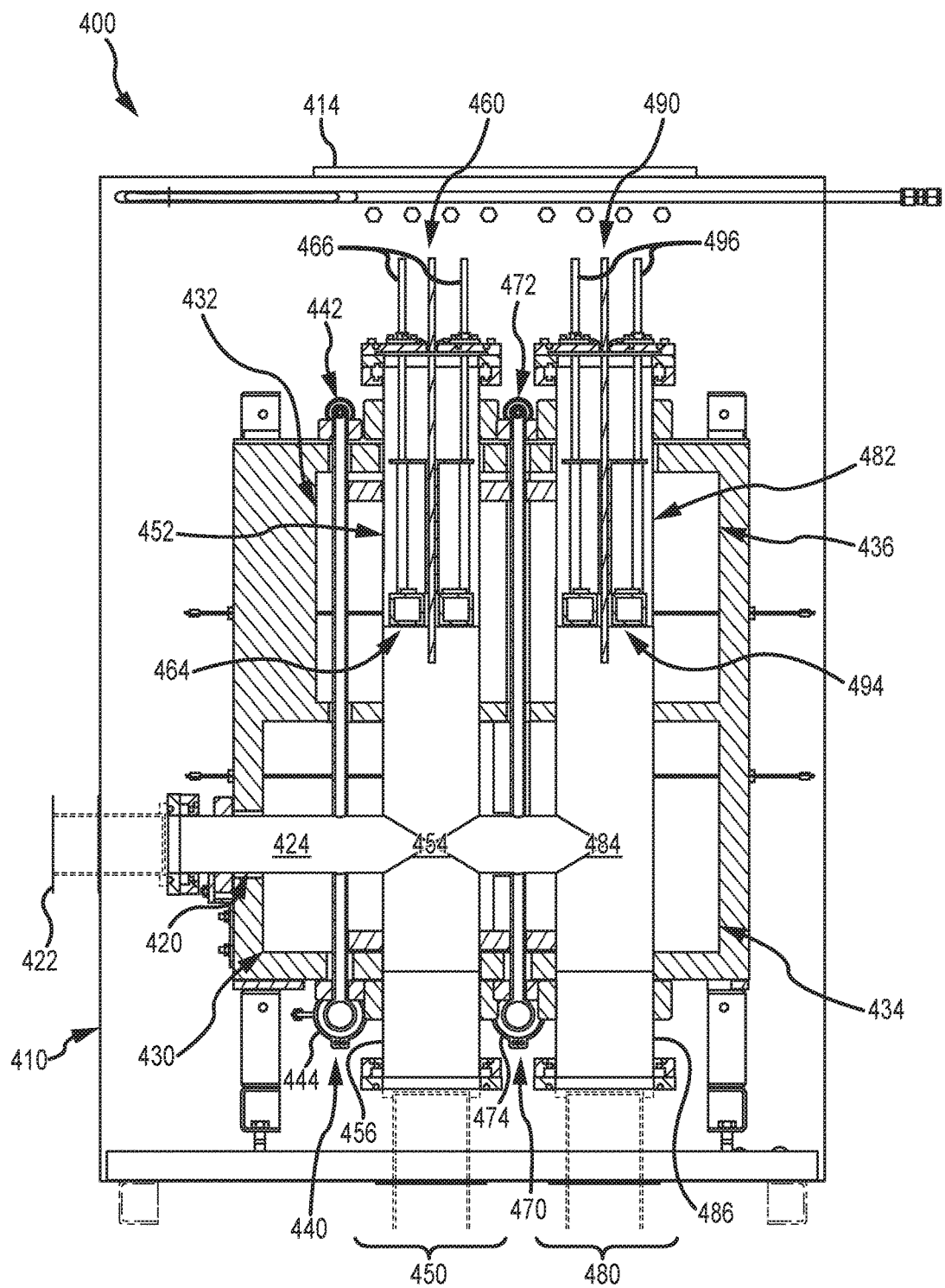
FIG. 4 illustrates a side, partial sectional view of one implementation of an HVPE reactor adapted to be a semi-inline device.
Figure 5:
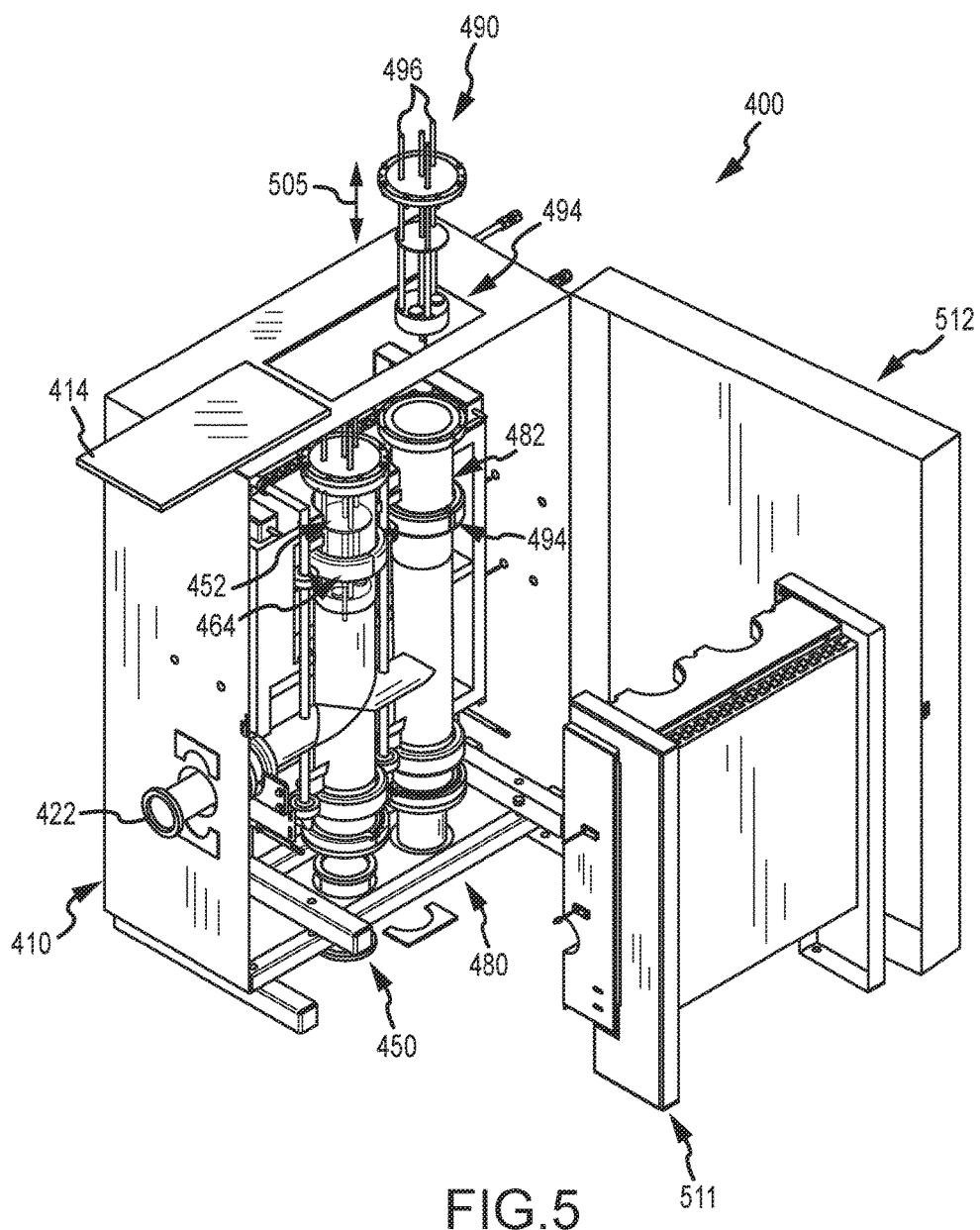
FIG. 5 shows the HVPE reactor of FIG. 4 with a perspective and partially exploded view.

The reaction tube 110 includes a load lock flange 114 at a first end of the body 112 and a transfer arm flange 118 at a second, opposite end of the body 112. The load lock flange 114 is configured for transferring samples or wafers/substrates into and out of interior space/volume of the reaction tube 110. In other implementations as shown in FIGS. 4 and 5, the transfer arm may be provided at the load end of the reaction tube. As shown, the first length or portion of the reaction tube 110 provides a heat-up or preheat zone 119 of the reactor 100. A gas inlet line 115 may be provided to the body 112 of the reaction tube 110 such that during operation of the reactor 100 an overpressure of a gas such as arsine may be provided to prevent or limit the wafers or samples from decomposing while in the heat-up zone 119. For example, the arsine or other overpressurizing gas may be provided at a flow rate of 20 to 30 standard cubic centimeters per minute (sccm) such as at about 25 sccm.

The reactor 100 is adapted to have a plurality of temperature or heat zones that may be maintained on an ongoing basis at temperatures falling within desired temperature ranges. This configuration is facilitated by providing two or more reaction chambers 120, 140 along with the separate heat-up zone 119, which allows different and spaced apart temperature zones to be heated up (by heaters not shown in FIG. 1) to a desired temperature and retained in a range about this temperature to suit the differing deposition and/or growth processes (e.g., HVPE processes) occurring in each reaction chamber 120, 140 and heat-up zone 119. Specifically, the reactor 100 is shown to include four temperature zones 170, 172, 174, and 176 shown with dashed lines generally associated with boundaries of such heated spaces.

As shown, the first temperature zone 170 encapsulates the heat-up zone 119 of the reaction tube 110 and also a deposition or growth zone 130 of the first reaction chamber 120 as well as reaction tube exhausts 132, 138. It may be desirable, for example, for the deposition or growth zone 130 to be heated to a temperature in the range of 650 to 720° C. during operation of the HPVE reactor 100. The second temperature zone 172 encapsulates or includes the mixing zone 124 of the first reaction chamber 120, and it may be useful for the heaters in this zone 172 to be operated to retain the second temperature zone 172 and its contained equipment at a different temperature such as one in the range of 800 to 850° C. The third temperature zone 174 encapsulates or includes the deposition or growth zone 150 of the second reaction chamber 140 as well as exhausts 152, 158, 162.

As mentioned in the prior paragraph, the third temperature zone 174 may be operated to keep the deposition or growth zone 150 at a temperature in the range of 650 to 720° C. (e.g., for InGaP growth but may be set differently for another material or alloy), which may match the temperature of the first temperature zone 170 but often will differ to suit deposition of differing materials or growth of a different layer than in the first reaction chamber 120. Further, a fourth temperature zone 176 is provided in the reactor 100 to encapsulate and heat the mixing zone 144 of the second reaction chamber 140 to a desired temperature, such as a temperature in the range of 800 to 850° C. Again, this temperature may be the same or similar to that of the second temperature zone 172 but often will differ to suit the materials being mixed in the mixing zone 144. Through the use of four differing temperature zones (but more may be provided in an inline arrangement such as two per reaction chamber of the line), the reactor 100 can be used to provide nearly continuous deposition of layers/material without the need for heating up or cooling down portions of the reactor between layers.

The reactor 100 includes mechanisms for separating portions of the reaction tube 110 such that the heat-up zone 119 can be kept chemically isolated (or substantially so) from the deposition zone 130 of the first reaction chamber 120, which can, in turn, be isolated or separated from the deposition zone 150 of the second reaction chamber 140. This allows the steady state chemistry to be established in differing zones and retained throughout operations of the reactor 100 even while a sample/wafer (not shown in FIG. 1) is moved along the length of the travel or transfer path 116 within the reaction tube 110 between the various growth/deposition zones 130, 150 and the heat-up zone 119.

The chemical separation or isolation on reactor 100 may be provided in a variety of ways. For example, a selectively positionable or retractable barrier may be used that opens and closes zones in tube 110. In another implementation, physical shields or walls may be provided on both sides of the transfer platform used to move a sample or wafer through the reaction tube 110. In other cases, as shown, gas curtains are used to chemically separate the zones or portions of the reaction tube 110. To this end, a gas inlet line 136 is provided with an outlet to the body 112 of the reaction tube 110 disposed between the heat-up zone 119 and the deposition zone 130 of the first reaction chamber 120. An exhaust 138 for the curtain gas flow is provided on an opposite side of the body 112 of the reaction tube 110, and, during operations of the reactor 100, a flow of an inert gas (such as hydrogen or argon) generates a curtain 137 across the inner space of the tube 110 to prevent or limit crosstalk/contamination between zones 119 and 130 while allowing a sample/wafer to be moved between these zones 119 and 130.

The flow rate may be varied to achieve the curtain 137 with an exemplary implementation using a flow of hydrogen of up to 2 to 3 or more SLM (standard liters per minute). Gas curtains 157, 160 may also be provided by providing a similar gas flow (e.g., of an inert gas such as hydrogen) via an inlet line or manifold with outlets between the first and second reaction chambers 120 and 140 (and the deposition chambers 130 and 150) and downstream of the deposition chamber 150. Exhausts 158, 162 are provided in the tube 110 for these two curtains 157, 160. The three exhausts 138, 158, 162 may be in the temperature zones 170 and 174 or may alternatively be outside these heated zones 170 or 174 (as shown for exhaust 158).

As discussed, the reactor 100 is configured with a first and a second reaction chamber 120, 140 that are physically spaced apart along the reaction tube 110 and chemically isolated (in this example) by gas curtain 157. The first reaction chamber 120 includes an inlet tube or chamber 121, which may be formed of quartz or a metal with an appropriate inner coating. The inlet chamber 121 may be arranged vertically as shown, and a source boat 126 is supported within the chamber 121 at a distance (or height) from the reaction tube 110 and a deposition or growth zone 130 of the first reaction chamber 120. The reaction chamber 120 provides a source mixing zone 124 within the inlet chamber 121, and the height of the boat 126 above the tube 110 and deposition zone 130 is chosen to allow adequate mixing of reactants to occur prior to these materials entering the deposition zone 130. An optical view port 127 may be provided in the inlet chamber 121 proximate to the boat 126 to facilitate in situ gas monitoring. The boat 126 may be formed of quartz (or other materials) and may include one or more chambers or receptacles for containing source materials suited for the first reaction chamber 120 and deposition zone 130.

The mixing zone 124 is positioned within the second temperature zone 172 while the deposition zone 130 is positioned within the first temperature zone 170. During operation of the reactor 100, the mixing zone 124 portion of the reaction chamber 120 (or the inlet chamber 121) is heated to a temperature within a temperature range (e.g., 800 to 850° C.) by a heater(s) associated with the second temperature zone while the deposition zone 130 is concurrently heated to a different temperature within a different temperature range (e.g., 650 to 720° C.). Further, during reactor operations, one or more supply gases (carrier gases) 122 are provided via a gas manifold and gas supplies (not shown), and, in many situations, the supply gases 122 include hydrogen chloride (HCl). The first deposition zone 130 may be adapted for growth of III-V films (e.g., GaAs, InAs, and the like as well as non-binary compounds), and, in such cases, the source mixing zone 124 may include a boat 126 adapted for containing Group III metals and a manifold for introduction of gases 122 useful for growing GaAs or similar films in the deposition zone 130. An optical view port 131 may be provided in the reaction tube 110 to allow monitoring of in situ growth within the deposition zone 130.

The second reaction chamber 140 includes an inlet tube or chamber 141, which may be formed of quartz or a metal with an appropriate inner coating. The inlet chamber 141 may be arranged vertically as shown, and a source boat 146 is supported within the chamber 141 at a distance (or height) from the reaction tube 110 and a deposition or growth zone 150 of the second reaction chamber 140. The reaction chamber 140 provides a source mixing zone 144 within the inlet chamber 141, and the height of the boat 146 above the tube 110 and deposition zone 150 is chosen to allow adequate mixing of reactants to occur prior to these materials entering the deposition zone 150. An optical view port 147 may be provided in the inlet chamber 141 proximate to the boat 146 to facilitate in situ gas monitoring. The boat 146 may be formed of quartz (or other materials) and may include one or more chambers or receptacles for containing source materials suited for the second reaction chamber 140 and deposition zone 150.

The mixing zone 144 is positioned within the fourth temperature zone 176 while the deposition zone 150 is positioned within the third temperature zone 174. During operation of the reactor 100, the mixing zone 144 portion of the reaction chamber 140 (or the inlet chamber 141) is heated to a temperature within a temperature range (e.g., 800 to 850° C.) by a heater(s) associated with the second temperature zone while the deposition zone 150 is concurrently heated to a different temperature within a different temperature range (e.g., 650 to 720° C.). The inventors have successfully grown GaAs at temperature in excess of 750° C. such that higher temperature ranges (e.g., up to 780 to 800° C.) may be desirable, and, again, can and should be set per reaction chamber for the materials or alloys being deposited or grown. Under certain conditions, higher temperature growth may aid the achievement of higher growth rates (e.g., when growth is kinetically limited). When growing cells in the past in a single reactor, the temperature has been kept lower with the idea of coupling the GaAs growth with InGaP deposition that is more optimal at lower temperatures, but the HVPE reactors described herein are not subjected to such limitations as separate temperature ranges can be set for each layer being deposited in a multi-layer semiconductor device.

Further, during reactor operations, one or more supply gases (carrier gases) 142 are provided via a gas manifold and gas supplies (not shown), and, in many situations, the supply gases 142 include hydrogen chloride (HCl) and phosphine (e.g., with the HCl provided at 5 to 15 sccm such as at about 10 sccm and the phosphine at 20 to 30 sccm such at about 25 sccm). The second deposition zone 150 may be adapted for growth of AlBGaInAsPN-type films, and, in such cases, the source mixing zone 144 may include a boat 146 adapted with two receptacles or chambers for containing Ga and In and a manifold for introduction of gases 142 useful for growing AlBGaInAsPN or similar films/compounds in the deposition zone 150. An optical view port 151 may be provided in the reaction tube 110 to allow monitoring of in situ growth within the deposition zone 130.

The first and second deposition zones 130 and 150 typically are spaced relatively close together such as with a separation distance (where curtain 157 is provided) of about 3 to 12 inches, and the transfer mechanism for moving the wafer or substrate along the transfer path 116 is configured to quickly complete the deposition zone-to-deposition zone transfer, such as complete movement in less than 1 to 3 seconds. Such quick movement between deposition zones 130 and 150 (and to heat-up zone 119) eliminates (or at least limits) issues found in prior reactors in which growth was stopped/halted with a sample that was then held in place while chemistry and temperatures were reset in a single growth chamber.

The gas flow rates drive the deposition rate in the deposition zones 130 and 150 and may be tuned to achieve desired deposition rates such as up to 1 to 5 µm/minute, and, in some modeling, the following gas flow rates were provided or achieved in the reactor 100: hydrogen chloride at about 20 sccm; arsine at about 25 sccm; phosphine at about 25 sccm; and hydrogen in curtains at about 2 to 3 SLM.

The reactor 100 may be operated to grow nearly any multi-layered semiconductor device that has layers formed of materials such that it is well suited for HVPE-based deposition. For example, the reactor or reactor system 100 may be used to grow heterojunction devices, and the growth sequence may be varied or selected to suit the device. The design of the HVPE reactor 100 provides a number of advantages in such semiconductor device production. The separated growth zones 130 and 150 for different materials allow the thermal equilibrium chemical reactions to reach steady state in each the reaction chambers 120 and 140. Again, the use of two (or more) reaction chambers allows the choice of specific growth temperatures suited for the materials deposited in each such chamber. The use of gas curtain zones 137, 157, and 160 prevents or at least limits mixing of reactant gases between deposition zones 130 and 150 (and between zone 130 and heat-up zone 119). Sharp, crystallographic interfaces can be grown by quickly moving the substrate between growth chambers 130 and 150 or by changing the dopant gases within a growth chamber (such as within chamber 120 while the sample/wafer is positioned in the heat-up zone 119 or in deposition zone 150 of the second reaction chamber 140). Further, the exhaust ports 132, 138, 152, 158, 162 are designed for easy cleaning of the system 100.

Figure 2:
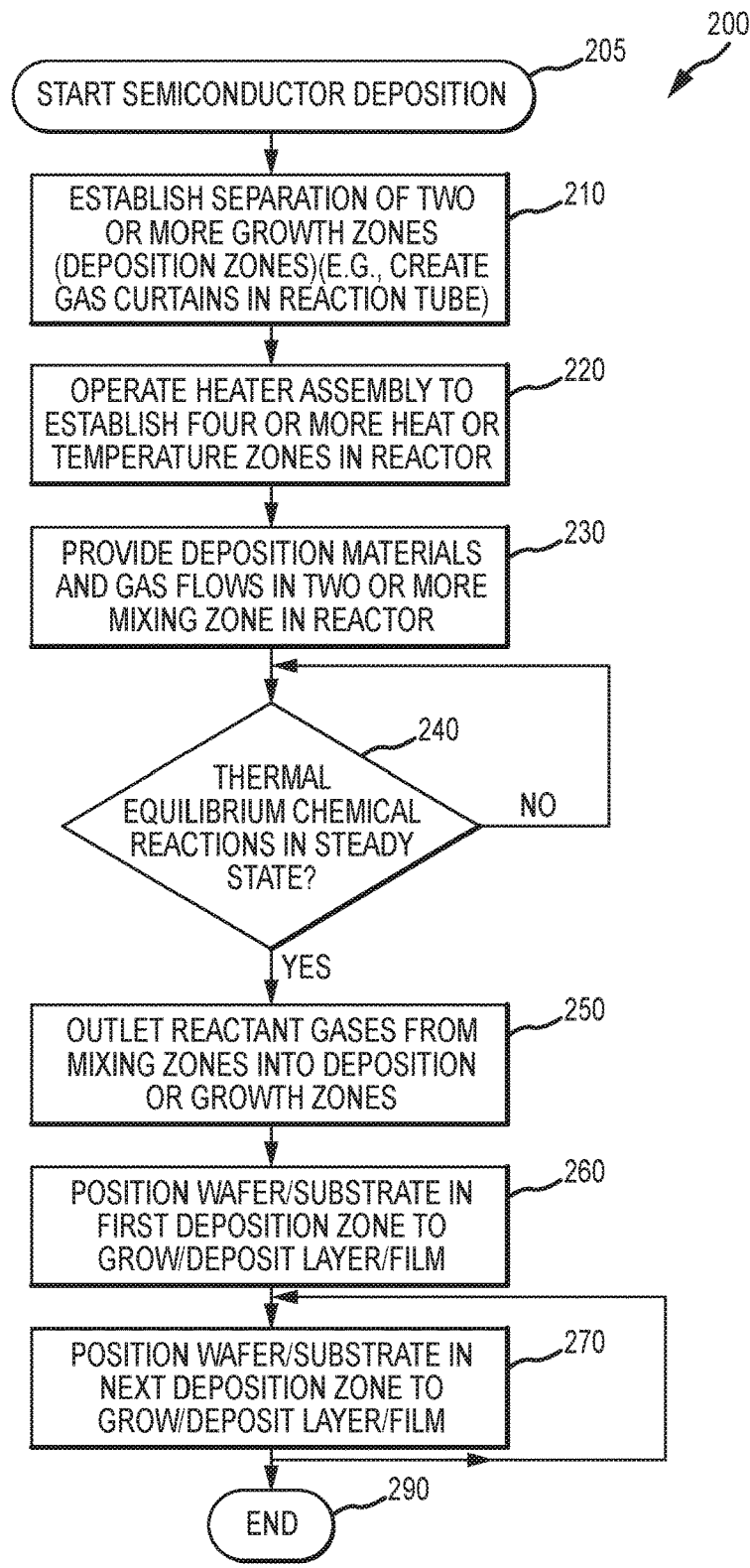
FIG. 2 illustrates a method for depositing material layers of a semiconductor device or product such as by operation of the reactor of FIG. 1 or another reactor described herein.

FIG. 2 illustrates with a flow chart exemplary steps or process of a method 200 for forming a semiconductor device using HPVE, and the method 200 may be performed by operation of the reactor 100 or another HPVE reactor with the features described herein. At 205, the method 200 starts such as selecting a semiconductor device to fabricate and based on this selection defining temperature settings for each of the temperature or heating zones, reactant/carrier gases and flow rates, and materials for use in source boats of the separated reaction chambers.

At 210, the method 200 continues with establishing separation of the growth or deposition zones in the reactor. For example, in the reactor 100, zone separating may involve providing a flow of inert gas at a rate adequate to establish one or more gas curtains such as curtain 157 and also curtains 137 and 160 in the reaction tube 110. At 220, the method 200 involves operating heaters of a heater assembly to establish preset temperatures (temperature ranges) for four or more heating or temperature zones. In the reactor 100, step 220 may involve operating four heaters to bring the temperature zones 170, 172, 174, and 176 up to four temperatures within predefined temperature ranges, which may be two matching growth temperature ranges and two matching mixing temperature ranges or the set points of each temperature zone may be independently set (e.g., four different set points and/or ranges may be used in the method 200).

Then, at 230, the method 200 continues with providing a source boat(s) in each of the inlet chambers defining the mixing zones of the reactor. In reactor 100, this may involve providing boats 126, 146 loaded with gallium, indium, and other materials (e.g., many boats are loaded once and used for numerous growth runs) in inlet chambers 121, 141 of the first and second reaction chambers 120, 140. Step 230 also includes initiating carrier or supply gas flows into or over the source boats (gas flows 122, 142 into the inlet chambers 121, 141) to create reactant mixing within the mixing zones such as in zones 124, 144, which are kept at preset mixing temperatures due to performance of step 220 (e.g., the temperature zones 172, 176 are used to keep mixing zones 124, 144 at desired temperatures). At 240, the method 200 involves adjusting and holding gas flow rates and temperatures of temperature zones (e.g., zones 172, 176) until the two (or more) thermal equilibrium chemical reactions in each of the mixing zones (such as zones 124, 144 in first and second reaction chambers 120, 140) have reached steady state.

Once steady state is reached and typically prior to this time, the method 200 continues at 250 with outputting the reactant gases from the mixing zone into the deposition or growth zones (note, though, there is typically no valve or other control device and the reactants continuously are output to or flowing out into the deposition zones 130, 150). For example, in reactor 100, the inlet chambers 121, 141 are configured to provide an outlet from the mixing zones 124, 144 into the reaction tube 110 coinciding with the deposition zones 130, 150 of the first and second reaction chambers 120, 140, and exhaust ports 132, 152 are provided on an opposite portion of the reaction tube 110 to provide a gas flow path out of the deposition or growth zones 130, 150. The gas curtains 137, 157, and 160 (created in step 210, which is repeated to retain such separation during the performance of method 200) act to trap the reactant gases within the deposition or growth zones 130, 150. Preheating of the substrate may be performed (e.g., in section 119) under $H_2/AsH_3$ or the like (as placing a cool substrate into a hot gas mixture may result in poor deposition on the cool substrate).

Then, with the reactor such as reactor 100 in a steady state of operations, the method 200 may continue at 260 with positioning a wafer or substrate in a first deposition zone in the reactor and keeping it in this chamber until a layer or film of the semiconductor is grown or deposited. Then, at 270, the wafer or substrate is moved to a next deposition zone and held there until a next layer or film is grown for a semiconductor device. Step 270 may then be repeated to grow additional layers/films on the semiconductor device or the method 200 may end at 290 once a final layer or film is grown. For example, in reactor 100, steps 260 and 270 may involve moving a wafer or substrate along path 116 from deposition zone 130 to deposition zone 150 and then back to zone 130. If method 200 is performed in an inline reactor, the next deposition zone would be in a reaction chamber provided downstream or down the line of the reaction tube with each wafer or substrate being moved sequentially between deposition or growth zones for growth of each layer (with or without use of heat-up or cool-down zones between growth zones).

Figure 3:
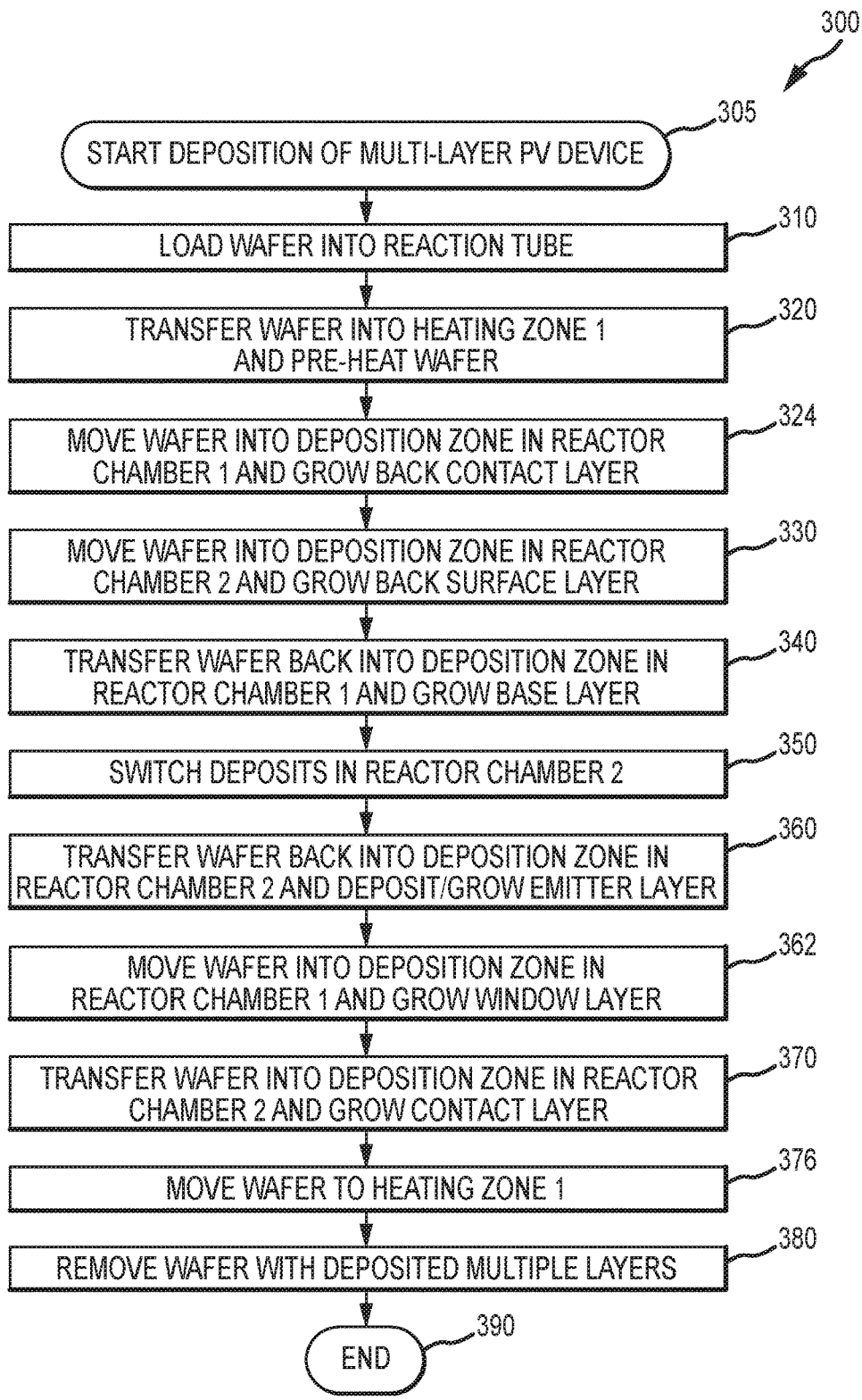
FIG. 3 illustrates another method for depositing or growing multiple layers of a semiconductor device that is suited for use with photovoltaic (PV) devices.

With the method 200 understood, it may be useful to discuss a more specific deposition method 300 shown in FIG. 3 for using the reactor 100 to grow a semiconductor device. During this discussion, particular materials and other values are provided that may be useful in producing PV devices using HVPE. For example, deposition of multi-layer devices can be achieved with the reactor design shown in FIG. 1. As an example, a high efficiency single junction GaInP/GaAs/GaAs/GaInP device can be grown by moving the substrate between the different zones and changing the dopant gases, and the method 300 is explained generally and then more specifically for this particular implementation or use of the reactor 100.

The deposition method 300 for a multi-layer device starts at 305 such as with performing steps 205-250 of the method 200 of FIG. 2 to place a reactor, such as reactor 100 of FIG. 1, in a steady state condition with temperatures and gas flows in the reaction chambers within desired ranges for the particular multi-layer device. At 310, the method 300 continues with loading a wafer into the reaction tube. For example, a GaAs wafer may be loaded into load zone of reaction tube 110 via the load lock flange 114. The method 300 may continue at 320 with transferring the wafer into a first heating zone to pre-heat the wafer up to into a desired temperature range. With reference to FIG. 1, this may involve moving the GaAs wafer into the heat-up zone 119 of the tube 110 so as to be within the first temperature zone 170. In this location and as part of step 320, the wafer may be heated into a growth range (e.g., 650 to 720° C. or higher or the range suited for the deposition of this layer of material) with an overpressure of arsine or the like inlet line 115.

The method 300 continues at 324 with moving the preheated wafer into a deposition zone of the first reactor chamber, and the wafer is held in the deposition zone for a period of time selected to be long enough to allow growth of a buffer layer. With reference to FIG. 1 and reactor 100, step 324 may involve moving the heated GaAs wafer into the deposition zone 130 of the reaction chamber 120 so as to grow p+ GaAs:Zn (e.g., a buffer layer) with corresponding operation of the mixing zone 124. The method 300 continues then with step 330 including moving the wafer with the buffer layer into a deposition zone in the second reactor chamber, and the wafer is held in this position and zone in the reactor for a period of time adequately long to grow a back surface layer. Again with reference to FIG. 1 and reactor 100, step 330 may involve moving the GaAs wafer with the back contact layer into the deposition zone 150 of the second reaction chamber 140 to grow p+ GaInP:Zn (back surface layer) with corresponding operation of the mixing zone 144.

Then, step 340 involves transferring the wafer back into the deposition zone of the first reactor chamber and holding the wafer here until a base layer is grown. In the operation of reactor 100, this may involve moving the wafer back into deposition zone 130 of the first reaction chamber 120 to grow p− GaAs:Zn (base layer) with corresponding operation of the mixing zone 124. At 350, the method 300 involves switching the dopants in the second reactor chamber. As part of operation of the reactor 100, this may involve switching dopants in the mixing zone 144 of the second reaction chamber 140 from Zn to $Se_4$ and arsine to phosphine flow. Then, at step 360, the wafer is transferred back into the deposition zone of the second reactor chamber and held in this position or zone until an emitter layer is grown. With regard to the reactor 100, this step 360 may involve moving the wafer from zone 130 into the deposition zone 150 in the reaction tube 110 and in the reaction chamber 120. With the change to the mixing zone 144, the n− GaAs:Se is grown on the wafer (e.g., an emitter layer).

The method 300 continues at 362 with moving the wafer into the deposition chamber of the first reactor chamber and holding it in this position to grow a window layer. With reference to operation of the reactor 100, this may include moving the wafer from deposition zone 150 through separating gas curtain 157 into the deposition zone 130 of the first reaction chamber 120. The mixing zone 124 is still in steady state operations such that a layer of n+ GaInP:Se is grown (i.e., a window layer for the PV device). Then, at 370, the method 300 includes transferring the wafer back into the deposition zone of the second reactor chamber and holding it here for a period of time so as to grow a contact layer with corresponding operation of the mixing zone. In reactor 100, this step 370 may include moving the wafer from deposition zone 130 through the separating gas curtain 157 into the deposition zone 150 of the second reaction chamber 140 and using output reactants from the mixing zone 144 to grow n+ GaAs:Se (i.e., a contact layer) on the wafer.

At 376, the wafer is moved out of the deposition zone into a heating zone such as out of reaction chamber 120 into the heated zone 119 of the first temperature zone, and the wafer may be held here for a preset time period or simply passed through this zone 119. At 380, the wafer with its grown/deposited multiple layers is then removed from the reaction tube (such as tube 110), and the method 300 ends at 390 (such as with additional fabrication or processing of the multi-layer semiconductor device to provide a final product).

The use of the methods 200 and 300 of FIGS. 2 and 3 (such as via operation of the reactor 100) provide a number of useful benefits. The methods 200 and 300 (or operation of the reactor 100) can provide a high deposition rate such as in the range of 1 to 5 µm/minute with HVPE-based deposition of materials for semiconductor layers. This deposition rate may be up to six times or more greater than that achieved using MOCVD. The faster deposition rate and other features of the method and associated HVPE reactor enables very sharp interfaces between different layers and can be used to grow thick and thin films (in the same or differing semiconductor devices). The method and associated reactor is also desirable because deposition is completed using (in some cases) cheaper source materials (e.g., when compared to those used in MOCVD or the like). Further, the resulting multi-layer products have clean thin films comparable to MOCVD.

The methods and reactors taught herein can be used to provide an inline reactor with multiple deposition chambers. The HVPE reactors may be fabricated as shown in FIG. 1 with a vertical orientation of chambers (such as inlet chambers containing source boats) with gas flows and exhaust arranged vertically. However, it should be understood that the reactor designs described herein may be implemented utilizing horizontally arranged reactor chambers including inlet tubes/channels and/or exhaust ports/tubes. The reaction tube is orthogonal to these inlet chambers, and the deposition zones contained therein are separated by gas curtains (or other separation mechanisms). In some implementations, each exhaust is bigger than its corresponding inlet into the reaction tube, and when this configuration is coupled with the gas curtain design, effective separation is maintained between reactor chambers (e.g., between side-by-side deposition or growth chambers/zones). The reactors provide at least four different temperature zones to maintain differing reactor zones and/or reaction chambers at differing temperatures, and these four (or more) temperature zones may be provided within the same furnace. The components of the reactor may be made of quartz and/or metal with interior surfaces protected against corrosion via a proper coating or corrosion resistant material. The reactor may further include optical view ports, for in situ growth monitoring, enabled by quartz light tubes, and it has been shown by the Applicants that the exemplary designs taught herein work well according to fluid dynamics modeling.

FIG. 4 illustrates an HVPE reactor 400 that may be used to perform the deposition methods and functions described herein (e.g., perform the methods 200 and/or 300) to produce multi-layer semiconductor devices. The reactor 400 includes an outer enclosure or housing 410 that may be adapted to contain the components of the reactor and provide access ports and openings. FIG. 5 shows the HVPE reactor 400 in a perspective and partially exploded view. With reference to FIGS. 4 and 5, it can be seen that FIG. 4 shows the reactor 400 with a front panel 512 removed as well as shell or inner enclosure member 511 removed to expose the reactor components. The enclosure 410 may be adapted for safety purposes to function as a nitrogen (or other gas) purge box, and nitrogen or other purge gas may be pumped into or supplied to the interior space of the enclosure 410 with the shell 511 in place and the front panel 512 on and sealed to create a purge atmosphere about the reactor components to limit fire risks in the event of leakage of hydrogen from the reactor 400.

The reactor 400 includes a reaction tube or tunnel 420 that may be provided as a hollow cylinder or tube formed of, for example, quartz or a properly coated metal. A load or inlet flange 422 is provided at one end of the reaction tube 420 to allow wafers or samples to be inserted into the reaction tube 420 and moved via a transfer arm or other mechanism along the length of the reaction tube 420. Within the reaction tube 420, the sample or wafer may be placed in a heating or heat-up zone 424, in a first deposition or growth zone 454, or in a second deposition or growth zone 484.

As discussed with regard to reactor 100 of FIG. 1, these three zones may be separated by a number of barrier devices or separation assemblies. In the reactor 400, a first gas curtain assembly 440 is used to separate the heating zone 424 and the first deposition zone 454 and a second gas curtain assembly 470 is used to separate the first deposition zone 454 and the second deposition zone 484. The first and second gas curtain assemblies 440, 470 include gas inlet lines/manifolds 442, 472 that are adapted for connection to a curtain gas source (e.g., a source of hydrogen) and to direct flow of this curtain gas into the reaction tube 420 as shown in FIGS. 4 and 5. This flow is provided at an adequate flow rate (such as 1 to 3 SLM) to create a curtain of inert gas that limits mixing of gases between zones 424, 454, and 484. Each assembly 440, 470 further includes an exhaust line or port 444, 474 to provide a flow path for the inert curtain gas to exit the reaction tube 420 (e.g., to define the curtain between an inlet and an outlet on opposite sides of the reaction tube 420).

The HVPE reactor 400 is adapted to control the components and zones 424, 454, 484 at a number of differing temperatures, e.g., within four different temperature zones four different temperature ranges may be maintained (as discussed above with regard to FIG. 1 and reactor 100). To this end, the reactor 400 includes a heater assembly made up of four independently controlled heaters 430, 432, 434, and 436. For example, these may be ceramic fiber heaters or the like that are configured to encapsulate (or receive in heat conducting or radiating contact) components of the reactor 400.

Specifically, as shown, the heater 430 is shown to encapsulate and heat, when operated, the portions of the reaction tube 420 (and first reaction chamber 450) associated with the heating zone 424 and the first deposition zone 454. The heater 432 contacts and heats a mixing zone/portion of the first reaction chamber 450. The heater 434 contacts and heats a portion of the reaction tube 420 (and second reaction chamber 480) associated with the second deposition zone 484. The heater 436 contacts and heats a mixing zone/portion of the second reaction chamber 480. The volumes or spaces of the reactor 400 heated by each heater 430, 432, 434, 436 may be thought of temperature zones of the reactor 400. The temperature zone associated with the heater 430 may be kept at a first temperature range such as 730 to 740° C. in a PV deposition application. The temperature zone associated with the heater 432 may be kept at a second temperature range differing from the first temperature range such as 780 to 800° C. in the PV deposition application example of operation of the reactor 400. The temperature zone associated with the heater 434 may be kept at a third temperature range differing from both the first and second temperature ranges such as 630 to 670° C. (with a 650° C. set point in some cases). The temperature zone associated with the heater 436 may be kept at a fourth temperature range differing from the other three ranges such as 780 to 820° C. (with a 800° C. set point in some cases).

The temperature ranges may be varied during the operation of the reactor 400 to deposit multiple layers, but, in many cases, the temperature ranges for each of the heaters 430, 432, 434, 436 are set prior to initiating deposition and are retained throughout the growth or deposition of the multiple semiconductor layers so as to avoid the need for heating up or cooling down the various zones of the reactor 400 (e.g., a temperature steady state may be used in the reactor 400 through the use of four independently operated heaters).

The reactor 400 includes a first reaction chamber 450 and a second reaction chamber 480, which can each be operated (again, in a chemical steady state if desirable) to deposit or grow differing layers of a multi-layer semiconductor device. The first reaction chamber 450 includes an inlet port or channel 452 which may be formed from a hollow tube or cylinder such as with a quartz tube(s). The inlet port or channel 452 defines a space for providing a mixing zone for the first reaction chamber 450, and the mixing zone portion of the reaction chamber 450 is heated by the heater 432. The reaction chamber 450 includes a source assembly 460 configured to achieve the mixing of the desired reactants in the inlet channel 452, and the source assembly 460 is inserted into or received within the interior of the inlet channel/tube 452.

Briefly, the source assembly 460 includes a source boat 464 that is supported within the mixing zone provided by the inlet channel 452, and source material(s) such as gallium may be provided in the source boat 464 and, during operation of the heater 400, heated to a mixing temperature range by the heater 432. Carrier gases are supplied into the source boat 464 via inlet gas lines 466 extending into along the inlet channel 452 into the source boat 464. The reactants or reactant gas then exits gas outlet holes in the top of the source boat 464. Gas flow then causes the reactants to feed into the first deposition zone 454 in the reaction tube 420, which is heated by the heater 430 to a temperature set for the associated temperature or heating zone. The reactant gases then exit the reaction tube 420 via the exhaust port 456 of the first reaction chamber 450.

The second reaction chamber 480 is configured similarly to the first reaction chamber 450 with an inlet tube or channel 482 that defines a mixing zone or space for the second reaction chamber 480 and opens at its bottom end to the second deposition zone 484 in the reaction tube 420. A source assembly 490 is mated with the inlet tube 482, and the source assembly 490 includes a source boat 494 adapted with one or more receptacles or walled spaces for receiving source material(s) such as indium, gallium, and the like. The source boat 494 may have the same configuration as the source boat 464 or, as is the case in many applications, the source boat 494 may have a different number of receptacles or material storage spaces for receiving a greater (or smaller) number of materials and/or for providing a different ratio of such materials. For example, the source boat 464 may have two equal sized receptacles while the boat 494 may have two different sizes receptacles to provide more of one source material than another (e.g., more indium than gallium by providing the indium in a receptacle with a larger surface area exposed to the input carrier gases, which may be provided into each boat receptacle or wall-defined space separately to allow the same or differing carrier gases to be presented to each source material).

During operation, the use of a vertically oriented inlet channel 482 (and mixing zone) causes the reactants exiting the source boat 494 to further mix as they drop downward (e.g., due, at least in part, to carrier gas flows via lines 496 connected to boat 494) until reaching the second deposition zone 484 to grow a layer of semiconductor material when a wafer or sample is positioned in this portion of the reaction tube 420. The reactants then flow out of the reaction tube 420 via the exhaust portion 486 of the second reaction chamber 480. Again, the mixing zone of the second reaction chamber 480 about the source boat 494 is heated by the heater 436 while the deposition zone 484 in the reaction tube 420 is heated by the heater 434 such that these two zones of the reaction chamber 480 can be concurrently retained at two differing temperatures.

FIG. 5 illustrates that an access door or hatch 414 may be removed from the top of the enclosure/housing 410 to provide access to the two source assemblies 460, 490. As shown in FIG. 5, the source assembly 490 is being inserted into (or removed from) 505, and this may occur prior to HVPE-based fabrication of a particular semiconductor device including filling the source boat 494 and its chambers/receptacles with materials suited for the particular device and desired layers to be grown in the second deposition zone of the reactor 400. It is likely the source boat 494 will not require frequent refilling or replacement, but the reactor 400 is adapted to allow an operator to readily change out and refill the source boat such as prior to fabricating a device with differing layers grown in the second deposition chamber. While not shown, the source assembly 460 may also be removed and inserted into the inlet channel of the first reaction chamber 450 via the access hatch 414 in the enclosure 410.

Figure 6:
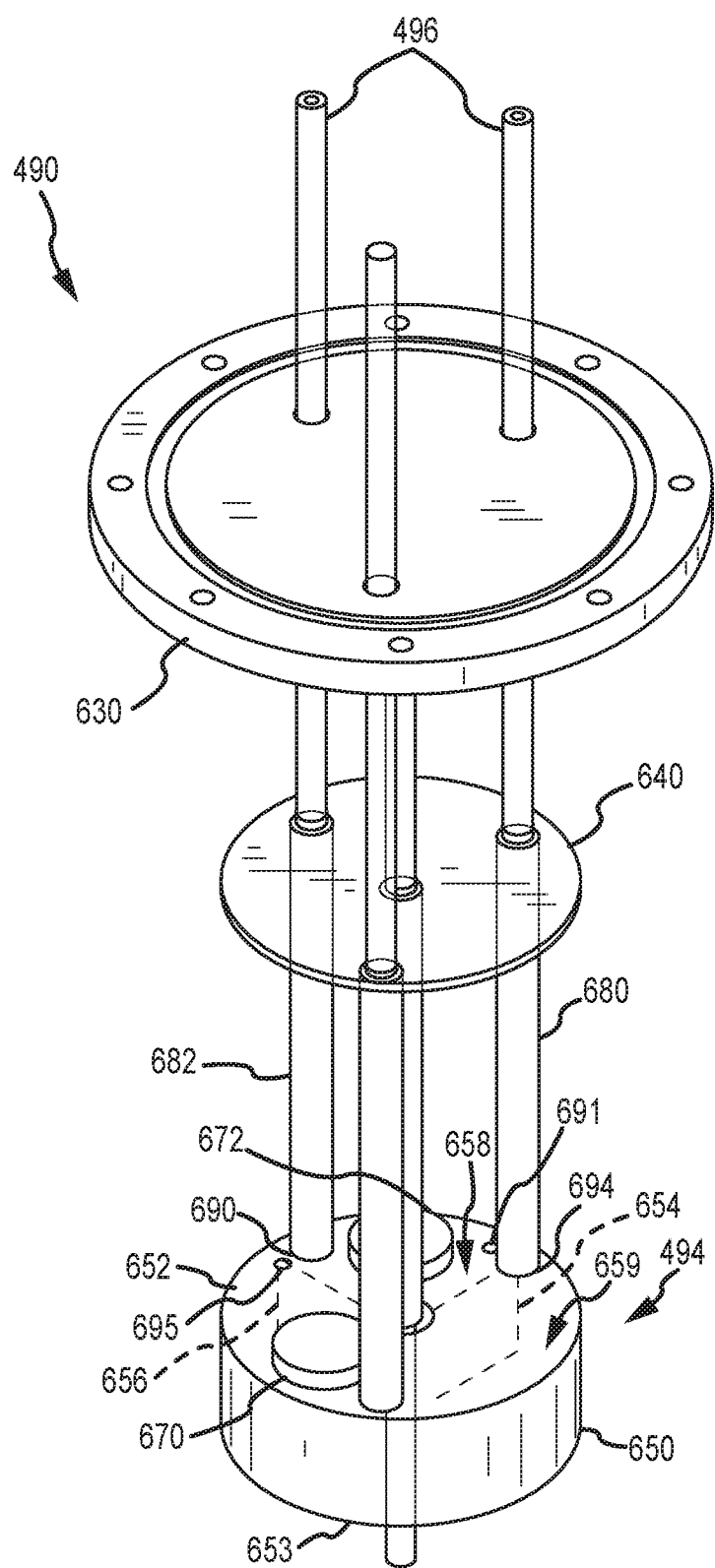
FIG. 6 is a perspective view of one of the source or boat assemblies of the reactor of FIGS. 4 and 5.

FIG. 6 illustrates a perspective view of the source or boat assembly 490 removed from the reactor 400. As shown, the source assembly 490 includes a pair of carrier gas inlet tubes 496 that extend through an end cap or plate 630 to the source boat 494. The inlet tubes 496 would be connected to a single carrier gas source (e.g., a source of HCl) or to two sources (e.g., HCl and another carrier gas) to allow differing gases to be fed to the different receptacles or chambers of the source boat 494. A thermal barrier 640, e.g., a plate of opaque quartz or the like) may be positioned between the end plate 630 and the source boat 494 in some implementations to trap heat within the temperature zone in which the source boat 494 is positioned and to deep cap 630 cool. Two or more thermal barrier supports 680, 682 may be provided to support the barrier 640 and may take the form, as shown, of tubes of a larger diameter than the carrier gas inlet tubes 496 such that they may receive the tubes 496 and mate at one end with the top cover 652 of the boat 494 and an the other end with the bottom surface of the thermal barrier 640.

The boat 494 is shown to be formed with a body 650 with a cover 652, and the body 650 is supported from the end plate/cap 630 (such as via a center support rod or other mechanism), which allows the body 650 to be suspended within an inlet channel/port of a reaction chamber of a reactor as described herein. The body 650 may be formed from a quartz tube or the like so that it defines a circular (or other) cross sectional shape and with an end cap or bottom plate 653. In this way, the body 650 defines a space or void for receiving and retaining source material for use in HVPE processes. The boat 494 further includes one or more walls or dividers that are positioned within this inner space/void of the body 650 so as to define two or more receptacles or chambers for containing two or more different source materials.

As shown, a first and a second dividers or walls 654, 656 are provided and extend out from the center of the void/ space of the body 650 (and extend between the top and bottom covers 652, 653 of the boat 494). These dividers 654, 656 define a first source chamber or receptacle 658 and a second source chamber or receptacle 659 in the body 650. The first and second source chambers 658, 659 may be the same size in some embodiments or differ in size, as shown, so as to provide a larger exposed surface area for one source material than for a second source material. For example, the chamber 659 may be used to receive indium while the smaller chamber 658 may be used for gallium in some implementations or uses of the source assembly 490 to achieve a desired amount of each of these materials within a mixing zone about or external to the boat 494. The ratios of the source materials and/or the amount of exposed surface area of each source material may be defined by the use of and locations of the dividers 654, 656 in the boat body 650.

Figure 7:
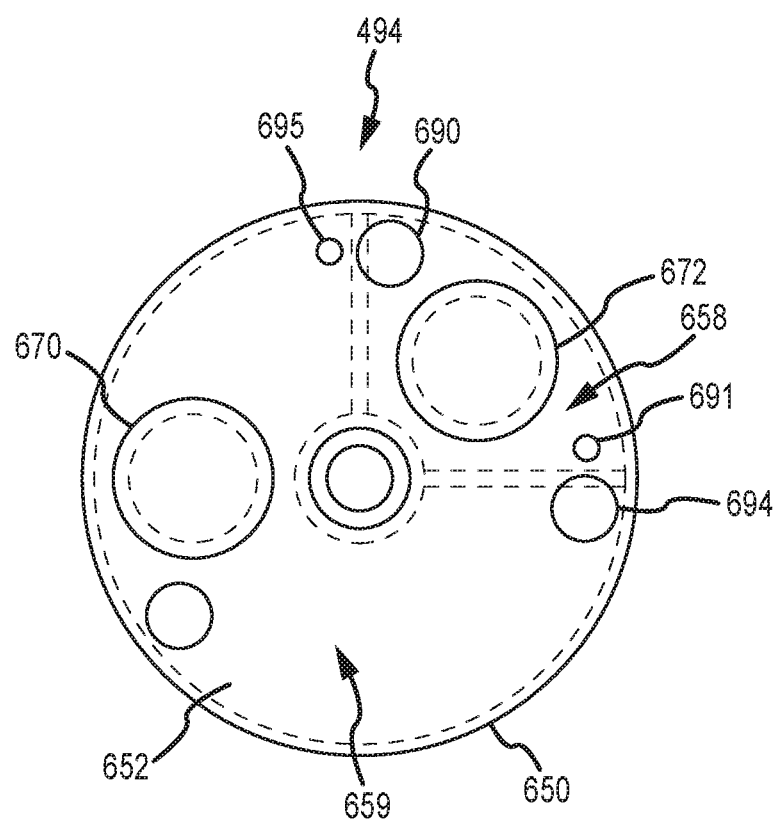
FIG. 7 is top view of a source boat that may be used in the source or boat assembly of FIG. 6.

With reference also to FIG. 7, it can be seen that the material or boat chamber 658 makes up about 25 percent of the volume of the body 650 while the material or boat chamber 659 makes up the other 75 percent of the volume (and, therefore, exposed surface area of source material in the boat 494). In other embodiments, though, the number and size of the partitioned volumes or boat chambers may differ to achieve a desired resulting reactant mix. The top cover/cap 652 includes a fill port for material chamber 659 shown to be covered with cap 670, which can be removed to allow a first source material to be placed in the boat 494. The top cover/cap 652 also includes a fill port for material chamber 658 that is shown to be covered with cap 672, which can be removed to insert a second source material into the boat 494. The material is typically not filled to the top cover 652 to allow a space for flow of and mixing with carrier gases in the chambers 658, 659.

The boat 494 further includes carrier gas inlets 690 and 694 into the material chambers 658 and 659 via the top cover 652. Further, gas outlets (or outlet/vent holes) 691, 695 in the cover 652 for material chambers 658 and 659. During operation of a reactor 400 containing the source or boat assembly 490, carrier gases would be fed through the inlet tubes 496 into the chambers 658, 659 via gas inlets 690 and 694. The carrier gases (which may be the same or different for the differing source materials such as indium and gallium) flow over the exposed surface of the material contained in the chambers 658, 659 and then the reactant gases flow out of the boat's interior spaces via gas outlets 691, 695 for further mixing in the mixing zone defined by the reaction chamber's inlet channel/tube prior to flowing a deposition zone. The outlets 691, 695 may be positioned so as to be spaced apart from the carrier gas inlets 690, 694 to increase the amount of mixing and contact between the carrier gas flow and the upper surfaces of the source material in each chamber/receptacle 658, 659 (e.g., be maximally spaced apart along the outer circumference or periphery of the chambers 658, 659).

While the prior reactor designs were shown as semi-inline devices, it may be useful in some cases to apply the concepts described here to a continuous or inline reactor design. For example, it may be useful in industrial and manufacturing settings to provide an HVPE reactor with multiple reaction chambers as discussed that are arranged to move a substrate or wafer in an inline manner through each of the chambers (without moving back to prior chambers). When the device being fabricated has more than two layers (as is typical), the HVPE reactor may be configured with a separate reaction chamber, which may take the form of the chambers shown for reactors 100 or 400, for each layer or film that is grown or deposited via HVPE techniques.

Figure 8:
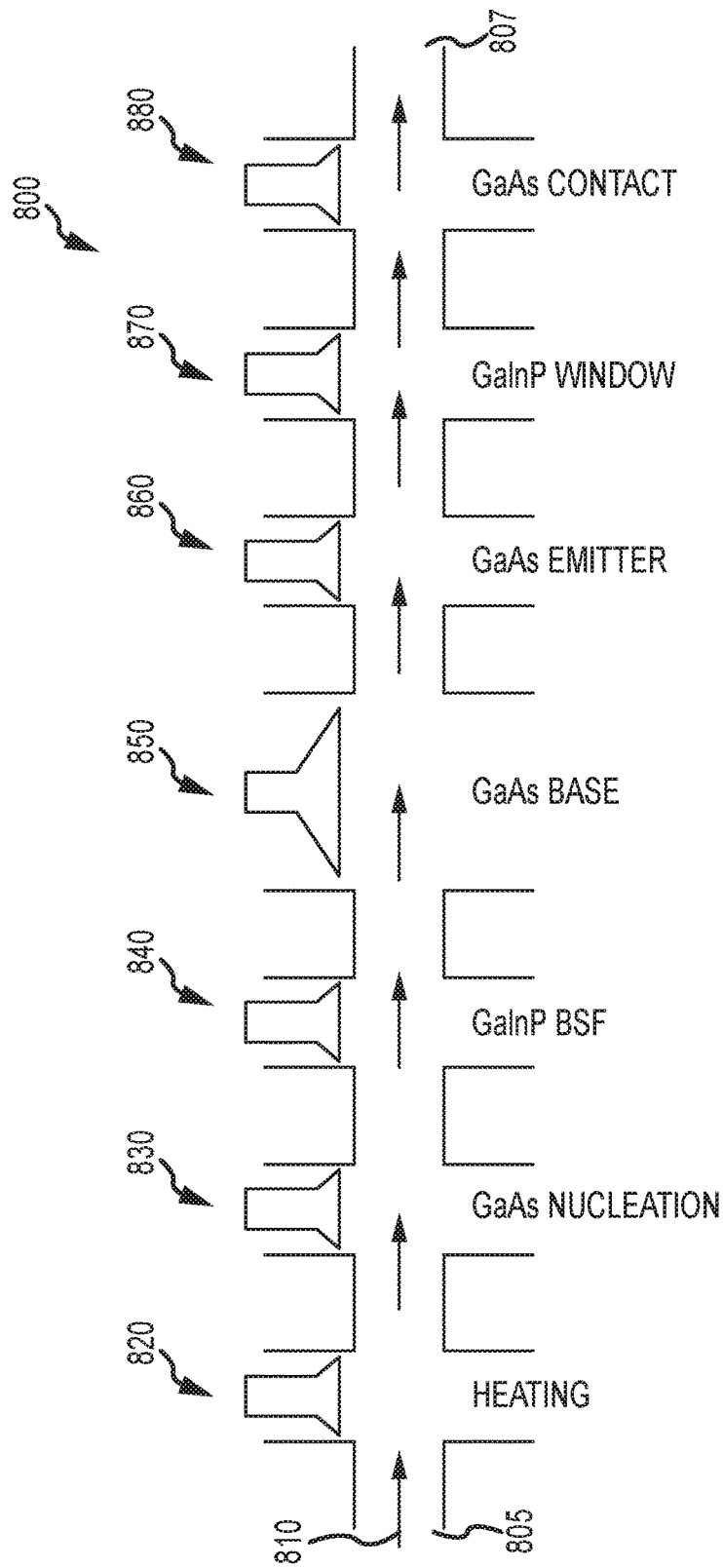
FIG. 8 is a schematic view of an HVPE reactor according to the present description arranged for inline growth or deposition of layers of a semiconductor device.

With this in mind, it may be useful to refer to FIG. 8, which illustrates schematically (or with a functional block diagram) a high throughput reactor 800 that is adapted for inline deposition of multiple layers on a semiconductor device. Particularly, the reactor 800 is adapted for growing the PV device produced via method 300 and for providing an inline or continuous homojunction or heterojunction growth procedure by its operations. As shown, the reactor 800 includes a reaction tube with an inlet 805 and an outlet 807, and a wafer or multi-layer product is moved as shown by arrows 810 along a transfer or travel path within the reaction tube. This causes the wafer to move through a plurality of heating and/or deposition zones, with each deposition zone associated with a different reaction chamber (details of included components not shown in FIG. 8 but understood from discussion of FIGS. 1-7). The thickness of each layer grown in each deposition zone/reaction chamber is controlled by the growth rate (preferably in the range of 1 to 5 µm/min) and the length of time spent in each growth zone (which may depend upon the speed of movement of the transfer mechanism/conveyor system and the length of the deposition/growth zone).

As shown for example, a GaAs wafer may be input in the inlet/loading flange 805 and be moved into a first zone 820 to begin fabrication of a homojunction PV device. This zone 820 may be used to heat the wafer to a first deposition temperature and/or to remove oxide, and an overpressurization of $AsH_3$ may be provided in the reaction tube. The reactor 800 may include devices for providing separation between the various inline zones such as, but not limited to, assemblies for generating an inert gas curtain between each zone (between each reaction chamber). Next, the wafer may be moved 810 to a first reaction chamber 830 with a mixing zone and growth zone for nucleating a p-GaAs buffer. Flow from the mixing zone may include Ga(GaCl). The wafer may then be moved through a gas curtain to a next reaction chamber 840 that includes a mixing and a deposition zone to grow or form via HVPE a p-GaInP back surface field, with flow into the deposition zone including $PH_3$ and In(InCl). Flow from the mixing zones of the reaction chambers may also include one or more dopants.

The reactor 800 is further designed to include a next reaction chamber 850 in which the wafer may be moved 810. The chamber 850 includes a mixing zone and a deposition zone that are configured for growth of a p-GaAs base layer on the wafer (i.e., on the GaInP BSF). The wafer may then be moved 810 into a next reaction chamber 860, which is adapted with a mixing zone and a deposition/growth zone to form an n-GaAs emitter on the wafer. The reactor 800 includes a reaction chamber 870 adjacent to the chamber 860 (but separated by a gas curtain or other separation mechanism), the wafer may be moved 810 into the deposition zone of this chamber 870 for deposition of or growth of an n-GaInP window layer (i.e., the chamber 870 includes a mixing zone with a source boat loaded with appropriate materials and with carrier inlet gas inlets to provide the desired reactants to form this window layer). The reactor 800 further includes a reaction chamber 880 with a mixing zone and a deposition zone that are adapted for forming an n+ GaAs contact layer on the wafer. Then, the wafer or GaAs PV homojunction device may be removed from the reaction tube and the reactor 800 via outlet 807.

In the reactors described herein, HVPE was used in part because of its inherent ability to grow high quality materials at high growth rates. The HVPE growth of GaAs, for example, is governed by the following reactions: (1) $xGa_{metal} + HCl_{vapor} \rightarrow xGaCl + (1-x)HCl + x/2 H_2$ and (2) $GaCl + AsH_3 \rightarrow GaAs + HCl + H_2$. HCl vapor flowing over molten Ga metal (e.g., in the source boats in the mixing zones of the reaction chambers) at elevated temperatures (e.g., 650 to 850° C.), as provided by the independently operated heaters or temperature zones, reacts to completion and forms GaCl according to the reaction of Equation (1) above. GaCl, when mixed with $AsH_3$ gas, will then react to form GaAs by the reaction of Equation (2) above.

The rate limiting mechanism for these two reactions may be input mass transport, which is characteristic of any equilibrium reaction. The near equilibrium nature of the HVPE reaction governs the growth rates essentially by how fast one can introduce reactants into the growth chamber or zone of the reaction tube in the described reactors. In some cases, though, deposition may be controlled by surface kinetics (e.g., the step in which Cl leaves the surface As-Ga-Cl species as HCl). This condition may be desirable because of enhanced deposition uniformity, as the growth rate is controlled by uniformity of the substrate surface temperature (which would be quite uniform in the vertical configuration of the reaction chambers shown in some examples herein). Further, increased partial pressure of GaCl eventually may retard growth rates, as these molecules bind strongly to surface sites and block the As needed for further growth. In some cases, it has been found that better material results are achieved from kinetically controlled growth, especially when there are multiple Group III species as in InGaP growth. Thick GaN substrates, used in the LED industry, can be grown by the HVPE techniques discussed herein in part because of the high growth rates afforded by the equilibrium process.

While a number of exemplary aspects and embodiments have been discussed above, those of skill in the art will recognize certain modifications, permutations, additions, and sub-combinations thereof. It is therefore intended that the following appended claims and claims hereafter introduced are interpreted to include modifications, permutations, additions, and sub-combinations to the exemplary aspects and embodiments discussed above as are within their true spirit and scope.

For example, the systems and reactors described herein may be used in the growth of such materials and devices as III-V's on GaAs, Ge, or Si, thick graded buffer layers for lattice-mismatched epitaxy, III-nitrides, optoelectronic devices, such as solar cells, lasers and LEDs, high-speed transistors, and highly-mismatched alloys such as dilute nitrides and dilute bismides, among others.

The invention claimed is:

1. A method of performing hydride vapor phase epitaxy (HVPE) deposition, the method comprising:
   providing at least one first source material and at least one first carrier gas flow to a first HVPE mixing zone coupled to a first deposition zone;
   providing at least one second source material and at least one second carrier gas flow to a second HVPE mixing zone coupled to a second deposition zone;
   heating the first deposition zone to a first temperature;
   heating the first HVPE mixing zone to a second temperature;
   heating the second deposition zone to a third temperature, wherein the third temperature is different from the first temperature;
   heating the second HVPE mixing zone to a fourth temperature;
   outputting, from the first HVPE mixing zone into the first deposition zone, first reactant gases produced from the at least one first source material and the at least one first carrier gas flow;

outputting, from the second HVPE mixing zone into the second deposition zone, second reactant gases produced from the at least one second source material and the at least one second carrier gas flow;

placing a substrate into the first deposition zone to grow a first layer from the first reactant gases; and placing the substrate into the second deposition zone to grow a second layer from the second reactant gases, wherein the heating of the first deposition zone to the first temperature and the heating of the second deposition zone to the third temperature are performed concurrently.

2. The method of claim 1, further comprising pre-heating the substrate in a heating zone prior to placing the substrate into the first deposition zone, wherein the heating zone is heated to the first temperature.

3. The method of claim 1, further comprising establishing a separation between the first deposition zone and the second deposition zone by providing a curtain of inert gas between the first deposition zone and the second deposition zone.

4. The method of claim 1, wherein the second temperature is higher than the first temperature.

5. The method of claim 1, wherein the second temperature is different from the fourth temperature.

6. The method of claim 1, wherein the placing of the substrate into the second deposition zone occurs within 1 second from completion of the placing of the substrate into the first deposition zone.

7. The method of claim 1, wherein the at least one first source material is provided by a first source boat within the first HVPE mixing zone.

8. The method of claim 7, further comprising positioning the first source boat at a distance from the first deposition zone that provides uniform mixing of the first reactant gases before outputting the first reactant gases into the first deposition zone.

9. The method of claim 1, wherein the at least one second source material is provided by a second source boat within the second HVPE mixing zone.

10. The method of claim 9, further comprising positioning the second source boat at a distance from the second deposition zone that provides uniform mixing of the second reactant gases before outputting the second reactant gases into the second deposition zone.

11. The method of claim 1, wherein the heating of the first deposition zone to the first temperature and the heating of the first HVPE mixing zone to the second temperature are performed concurrently.

12. The method of claim 1, wherein the heating of the second deposition zone to the third temperature and the heating of the second HVPE mixing zone to the fourth temperature are performed concurrently.

13. The method of claim 1, wherein the heating of the first deposition zone to the first temperature, the heating of the first HVPE mixing zone to the second temperature, the heating of the second deposition zone to the third temperature, and the heating of the second HVPE mixing zone to the fourth temperature are performed concurrently.

14. The method of claim 13, wherein the first temperature, the second temperature, the third temperature, and the fourth temperature are different from each other.

15. The method of claim 1, further comprising placing the substrate into the first deposition zone to grow a third layer from the first reactant gases after placing the substrate into the second deposition zone to grow the second layer.

16. The method of claim 15, further comprising:
changing at least one dopant in the second HVPE mixing zone; and
placing the substrate into the second deposition zone to grow a fourth layer from the second reactant gases after placing the substrate into the first deposition zone to grow the third layer.

* * * * *